(12) United States Patent
Pagaila et al.

(10) Patent No.: US 9,142,515 B2
(45) Date of Patent: Sep. 22, 2015

(54) SEMICONDUCTOR DEVICE WITH PROTECTIVE LAYER OVER EXPOSED SURFACES OF SEMICONDUCTOR DIE

(71) Applicant: STATS ChipPAC, Ltd., Singapore (SG)

(72) Inventors: Reza A. Pagaila, Tangerang (ID); DaeSik Choi, Seoul (KR); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/087,653

(22) Filed: Nov. 22, 2013

(65) Prior Publication Data

US 2014/0077344 A1    Mar. 20, 2014

Related U.S. Application Data

(62) Division of application No. 12/837,562, filed on Jul. 16, 2010, now Pat. No. 8,642,381.

(51) Int. Cl.
  *H01L 23/552*  (2006.01)
  *H01L 21/56*  (2006.01)
  (Continued)

(52) U.S. Cl.
  CPC ............ *H01L 23/552* (2013.01); *H01L 21/561* (2013.01); *H01L 21/568* (2013.01); *H01L 21/6835* (2013.01); *H01L 23/34* (2013.01); *H01L 23/5226* (2013.01); *H01L 23/5389* (2013.01); *H01L 24/06* (2013.01); *H01L 24/92* (2013.01); *H01L 24/94* (2013.01); *H01L 24/97* (2013.01); *H01L 25/0657* (2013.01); *H01L 25/50* (2013.01); *H01L 23/3128* (2013.01); *H01L 23/3185* (2013.01); *H01L 24/05* (2013.01); *H01L 24/14* (2013.01); *H01L 2221/68327* (2013.01); *H01L 2221/68381* (2013.01); *H01L 2224/0401* (2013.01); *H01L 2224/04042* (2013.01); *H01L 2224/04105* (2013.01); *H01L 2224/06102* (2013.01); *H01L 2224/06181* (2013.01); *H01L 2224/1132* (2013.01); *H01L 2224/1145* (2013.01); *H01L 2224/11334* (2013.01); *H01L 2224/11462* (2013.01);
(Continued)

(58) Field of Classification Search
  CPC ................ H01L 2924/00; H01L 2924/15311; H01L 2224/32145; H01L 2224/97; H01L 25/0657; H01L 2924/01029
  See application file for complete search history.

(56) References Cited

U.S. PATENT DOCUMENTS

| 6,043,109 A | 3/2000 | Yang et al. |
| 6,204,562 B1 | 3/2001 | Ho et al. |

(Continued)

*Primary Examiner* — Jaehwan Oh
(74) *Attorney, Agent, or Firm* — Robert D. Atkins; Patent Law Group: Atkins and Associates, P.C.

(57) ABSTRACT

A semiconductor wafer has a plurality of first semiconductor die. A second semiconductor die is mounted to the first semiconductor die. A shielding layer is formed between the first and second semiconductor die. An electrical interconnect, such as conductive pillar, bump, or bond wire, is formed between the first and second semiconductor die. A conductive TSV can be formed through the first and second semiconductor die. An encapsulant is deposited over the first and second semiconductor die and electrical interconnect. A heat sink is formed over the second semiconductor die. An interconnect structure, such as a bump, can be formed over the second semiconductor die. A portion of a backside of the first semiconductor die is removed. A protective layer is formed over exposed surfaces of the first semiconductor die. The protective layer covers the exposed backside and sidewalls of the first semiconductor die.

25 Claims, 14 Drawing Sheets

(51) Int. Cl.
  *H01L 21/683* (2006.01)
  *H01L 25/065* (2006.01)
  *H01L 25/00* (2006.01)
  *H01L 23/538* (2006.01)
  *H01L 23/34* (2006.01)
  *H01L 23/522* (2006.01)
  *H01L 23/31* (2006.01)
  *H01L 23/00* (2006.01)

(52) U.S. Cl.
  CPC ........ *H01L 2224/11464* (2013.01); *H01L 2224/11849* (2013.01); *H01L 2224/11901* (2013.01); *H01L 2224/12105* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16225* (2013.01); *H01L 2224/2101* (2013.01); *H01L 2224/214* (2013.01); *H01L 2224/221* (2013.01); *H01L 2224/2919* (2013.01); *H01L 2224/32145* (2013.01); *H01L 2224/48091* (2013.01); *H01L 2224/48145* (2013.01); *H01L 2224/73207* (2013.01); *H01L 2224/73253* (2013.01); *H01L 2224/73265* (2013.01); *H01L 2224/81191* (2013.01); *H01L 2224/83192* (2013.01); *H01L 2224/9211* (2013.01); *H01L 2224/94* (2013.01); *H01L 2224/97* (2013.01); *H01L 2225/06513* (2013.01); *H01L 2225/06524* (2013.01); *H01L 2225/06541* (2013.01); *H01L 2225/06548* (2013.01); *H01L 2924/0103* (2013.01); *H01L 2924/01004* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01029* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/1306* (2013.01); *H01L 2924/13091* (2013.01); *H01L 2924/3025* (2013.01)

(56) References Cited

U.S. PATENT DOCUMENTS

| | | | |
|---|---|---|---|
| 6,429,530 | B1 | 8/2002 | Chen |
| 6,552,426 | B2 | 4/2003 | Ishio et al. |
| 7,009,300 | B2 | 3/2006 | Gacusan |
| 7,034,388 | B2 | 4/2006 | Yang et al. |
| 7,245,008 | B2 | 7/2007 | Lee |
| 7,405,139 | B2 | 7/2008 | Daubenspeck et al. |
| 7,479,407 | B2 | 1/2009 | Gehman et al. |
| 7,514,797 | B2 | 4/2009 | Chen et al. |
| 7,812,449 | B2 | 10/2010 | Kuan et al. |
| 2006/0249828 | A1* | 11/2006 | Hong .................... 257/686 |
| 2007/0178667 | A1 | 8/2007 | Lee et al. |
| 2007/0190689 | A1 | 8/2007 | Kaneko |
| 2007/0210432 | A1* | 9/2007 | Cablao et al. ........... 257/686 |
| 2007/0235216 | A1 | 10/2007 | Bae et al. |
| 2008/0029847 | A1 | 2/2008 | Guillermo et al. |
| 2008/0242000 | A1 | 10/2008 | Kwon et al. |
| 2010/0027233 | A1 | 2/2010 | Low et al. |
| 2011/0136342 | A1 | 6/2011 | Harada et al. |

\* cited by examiner

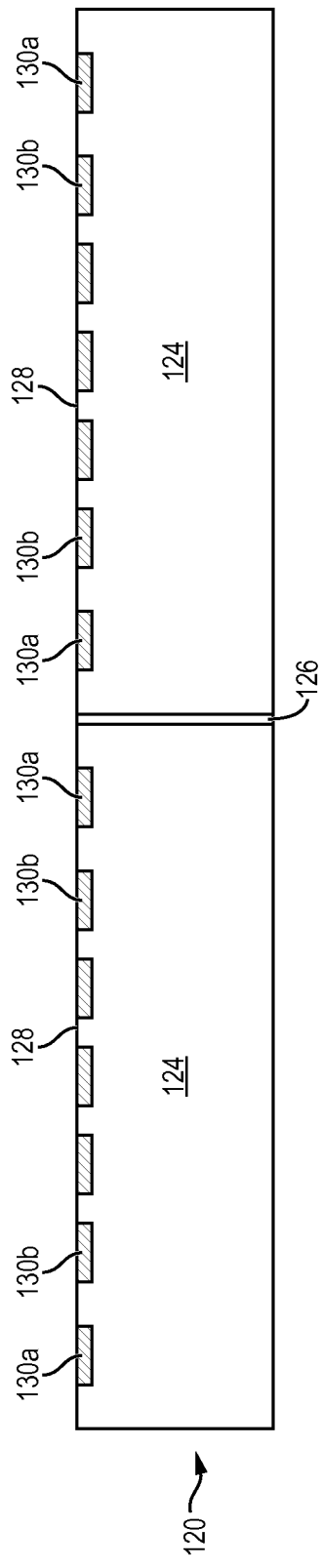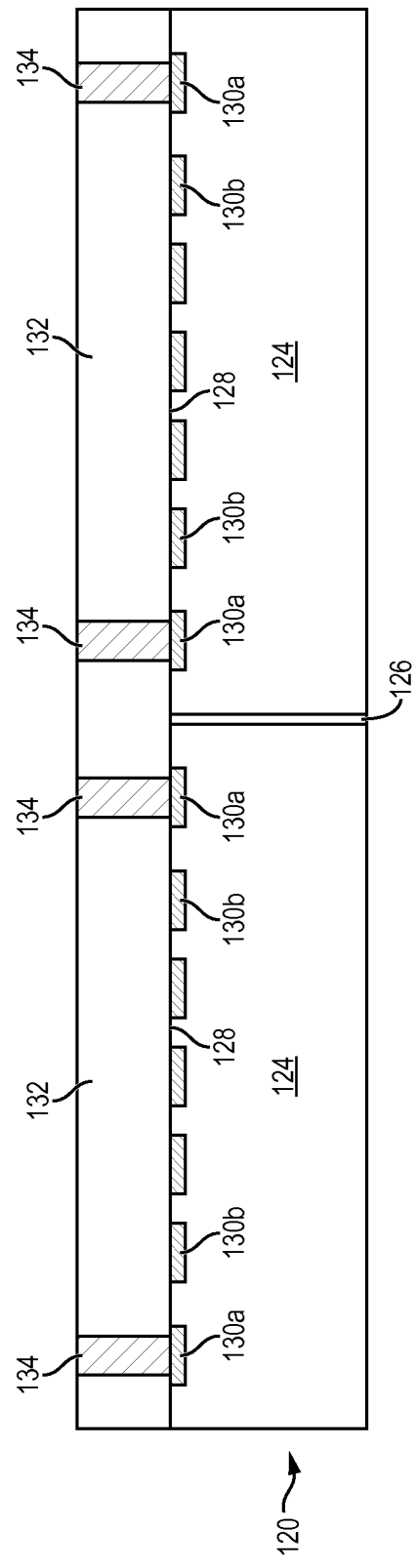

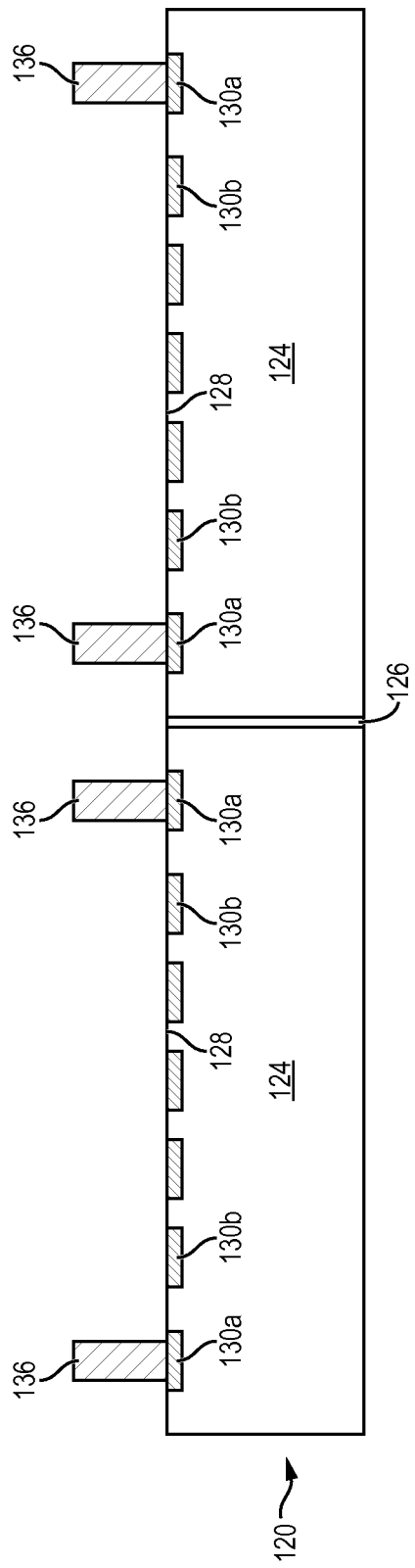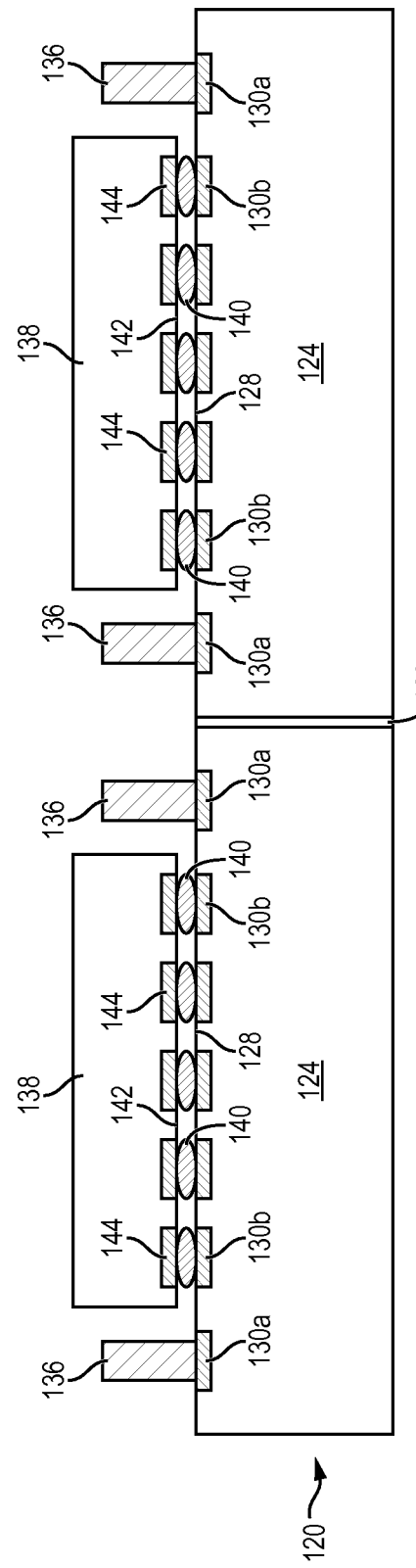

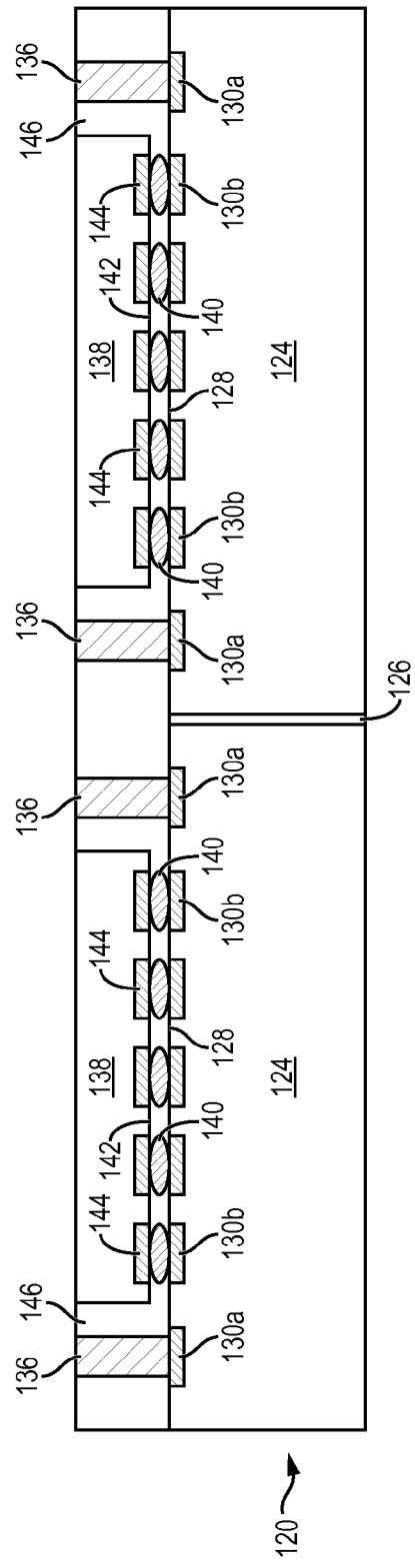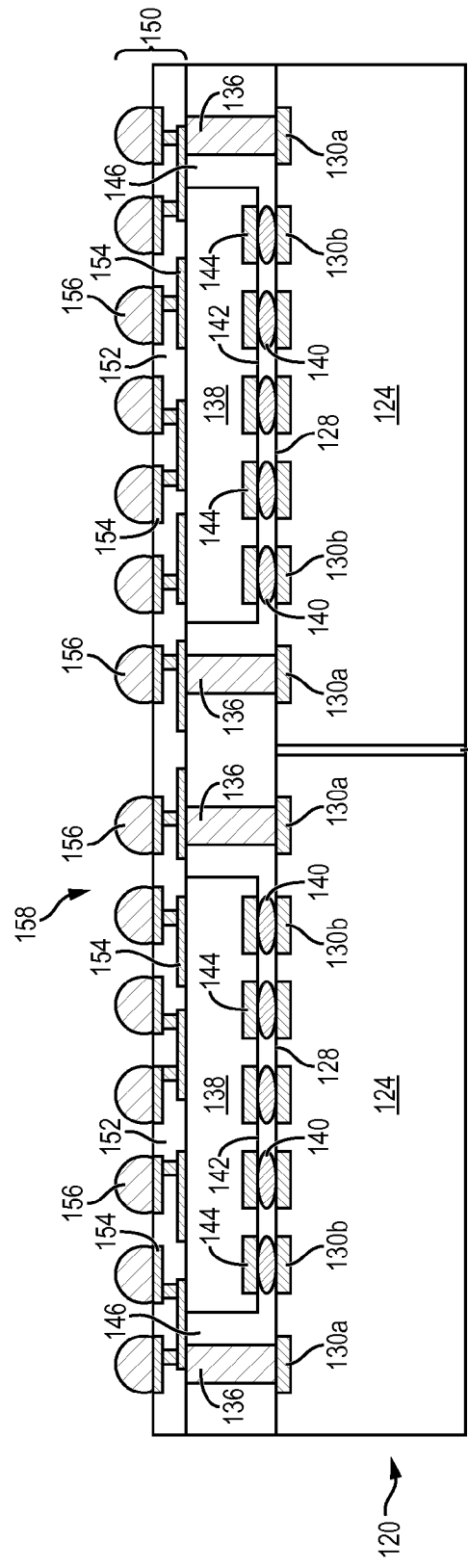

SEMICONDUCTOR DEVICE WITH PROTECTIVE LAYER OVER EXPOSED SURFACES OF SEMICONDUCTOR DIE

CLAIM TO DOMESTIC PRIORITY

The present application is a division of U.S. patent application Ser. No. 12/837,562, now U.S. Pat. No. 8,642,381, filed Jul. 16, 2010, which application is incorporated herein by reference.

FIELD OF THE INVENTION

The present invention relates in general to semiconductor devices and, more particularly, to a semiconductor device and method of forming a protective layer over exposed surfaces of a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices are susceptible to external stress, particularly to surfaces exposed to ambient conditions. The external stress can be dust, moisture, and mechanical force. The external stress can cause damage and reduce package life.

SUMMARY OF THE INVENTION

A need exists to protect exposed surfaces of a semiconductor die. Accordingly, in one embodiment, the present invention is a semiconductor device comprising a first semiconductor die and an interconnect structure formed over the first semiconductor die. A second semiconductor die is disposed over the interconnect structure and first semiconductor die. An encapsulant is deposited over the first and second semiconductor die. A protective layer is formed over an exposed surface of the first semiconductor die and extends to the encapsulant.

In another embodiment, the present invention is a semiconductor device comprising a first semiconductor die and a second semiconductor die disposed over the first semiconductor die. An encapsulant is deposited over the first and second semiconductor die. A protective layer is formed over the first semiconductor die and extends to the encapsulant.

In another embodiment, the present invention is a semiconductor device comprising a first semiconductor die and a second semiconductor die disposed over the first semiconductor die. An encapsulant is deposited over the second semiconductor die. A protective layer is formed over the encapsulant.

In another embodiment, the present invention is a semiconductor device comprising a first semiconductor die and an encapsulant deposited over the first semiconductor die. A protective layer is formed over the first semiconductor die and encapsulant.

DETAILED DESCRIPTION OF THE DRAWINGS

Figure 1:
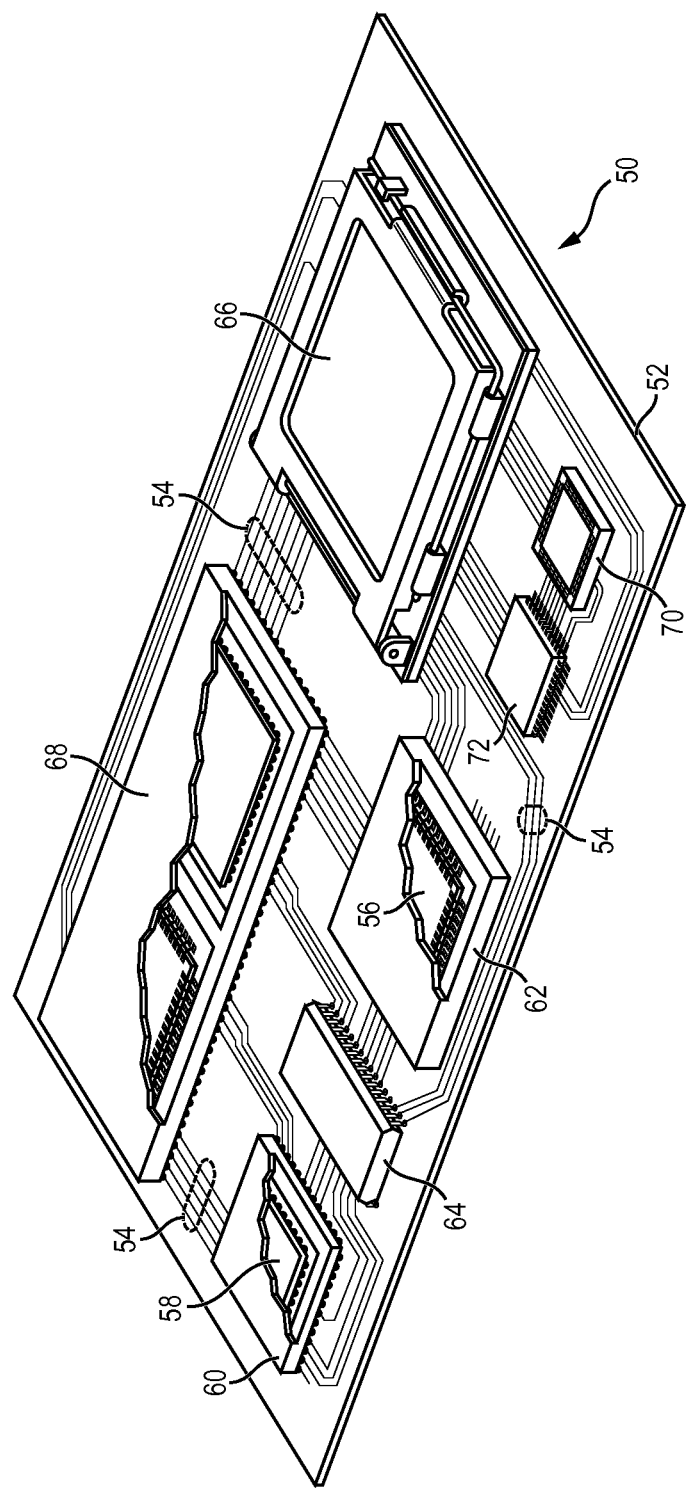
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
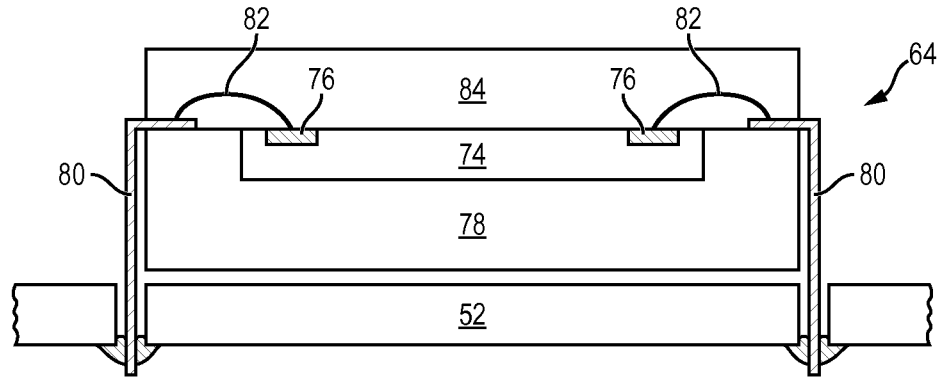
FIGS. 2*a*-2*c* illustrate further detail of the semiconductor packages mounted to the PCB.
Figure 2B:
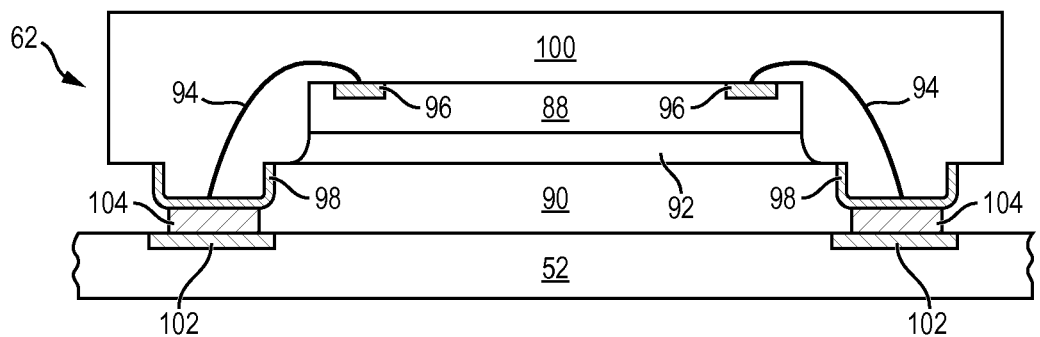
Figure 2C:
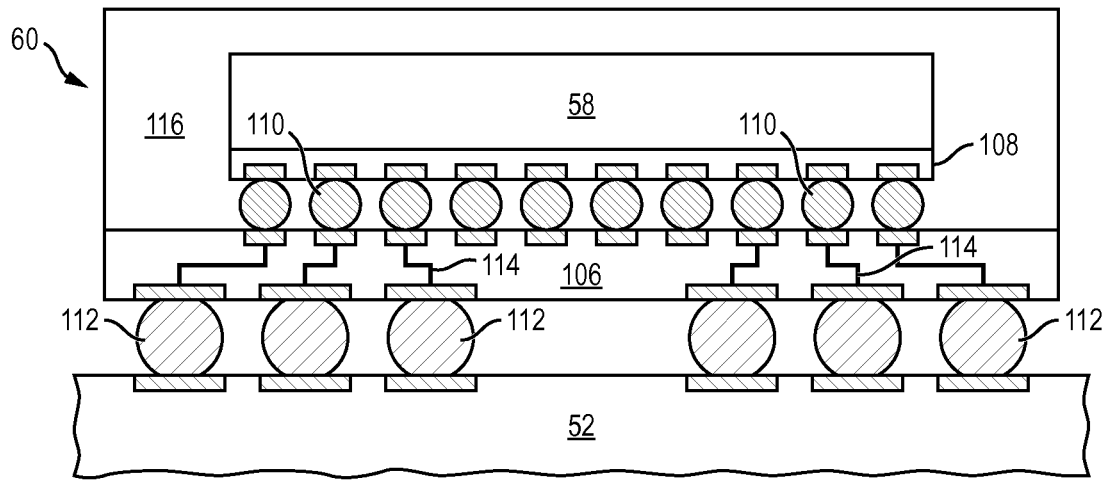

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
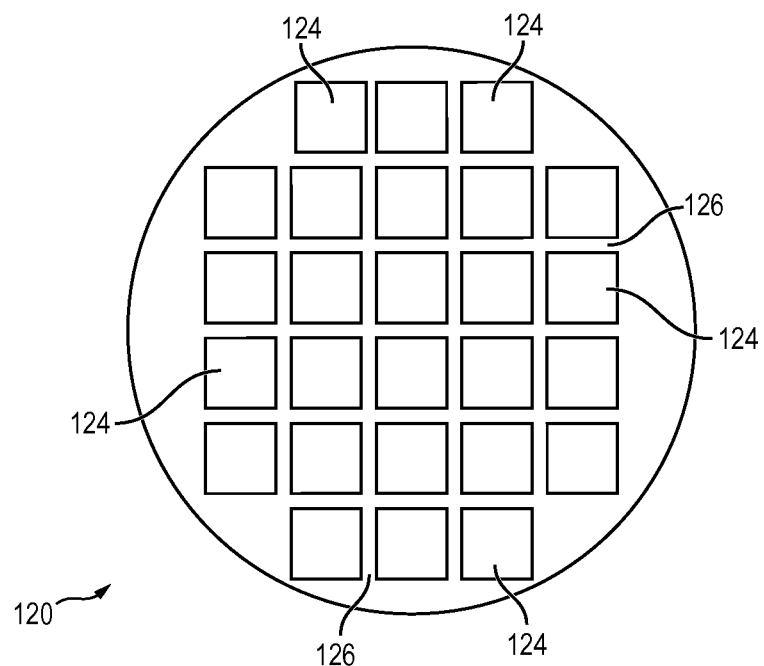
FIGS. 3*a*-3*o* illustrate a process of forming a protective layer over exposed surfaces of a semiconductor die.
Figure 3F:
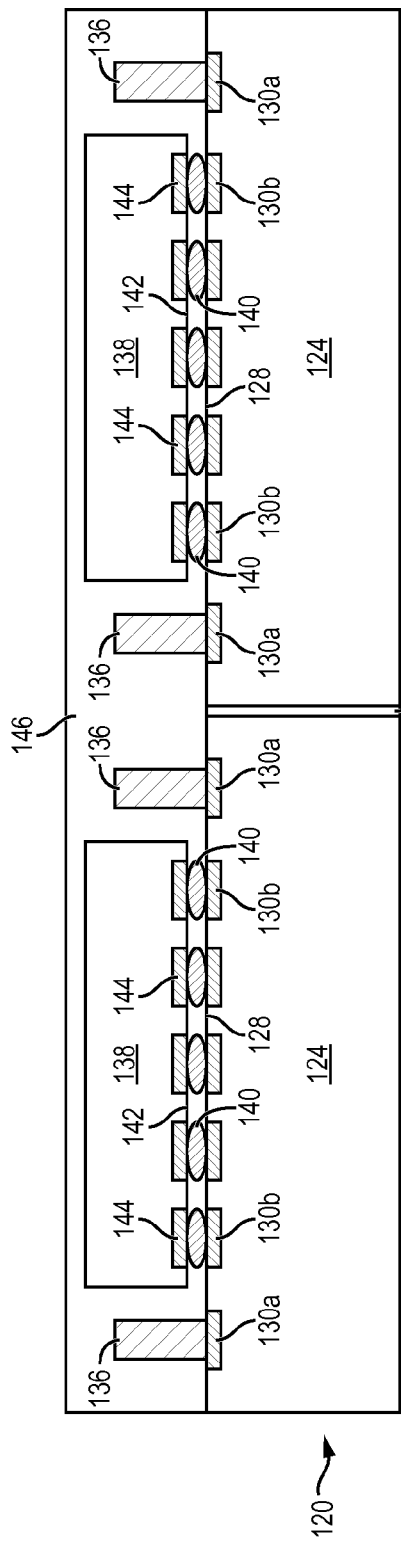
Figure 3G:
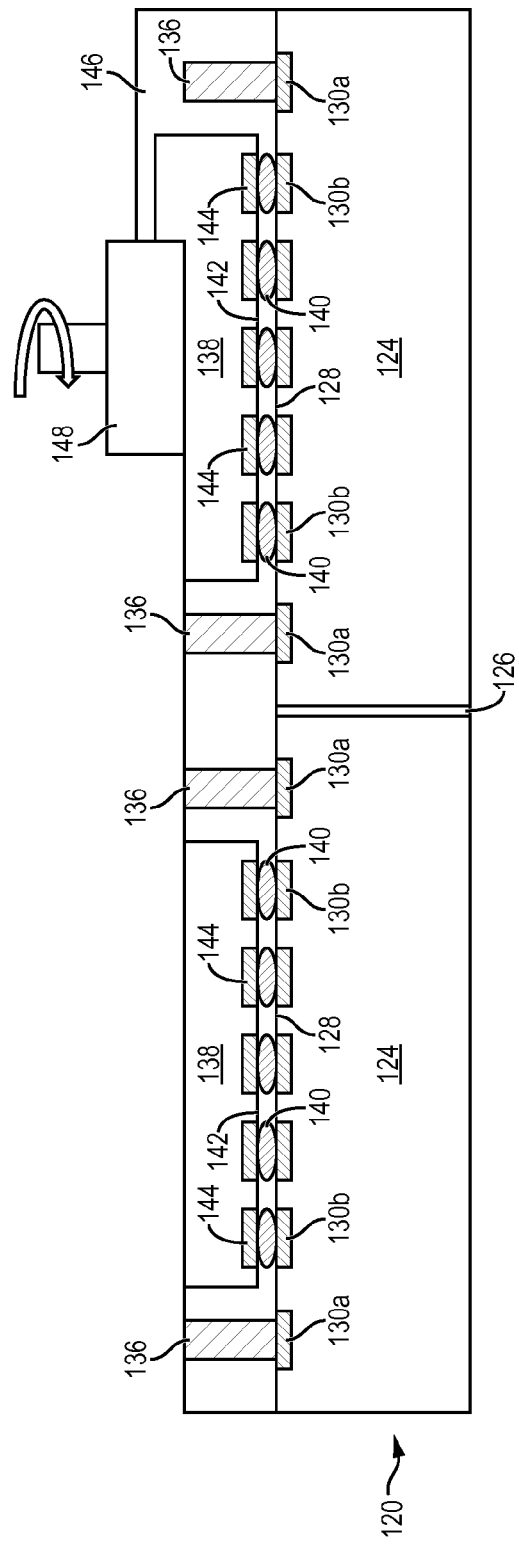
Figure 3J:
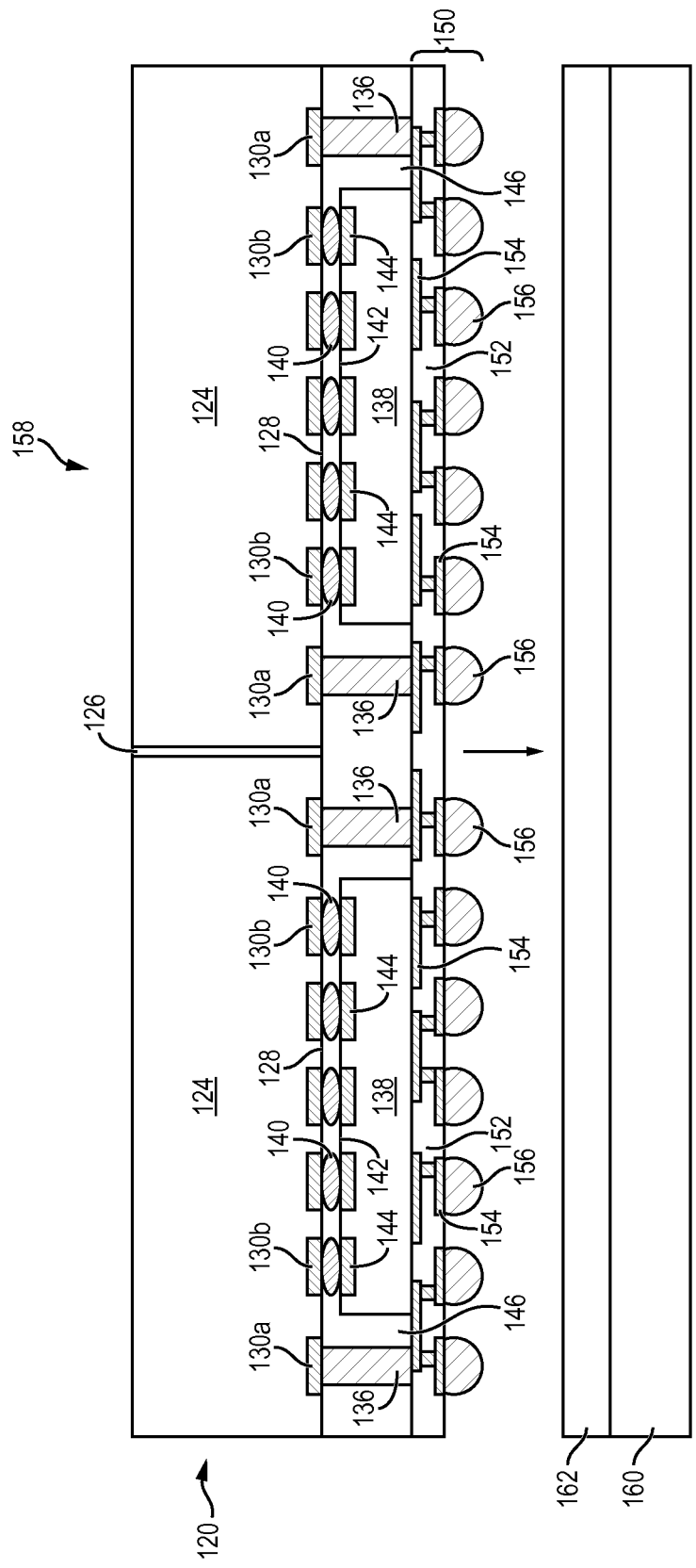
Figure 3K:
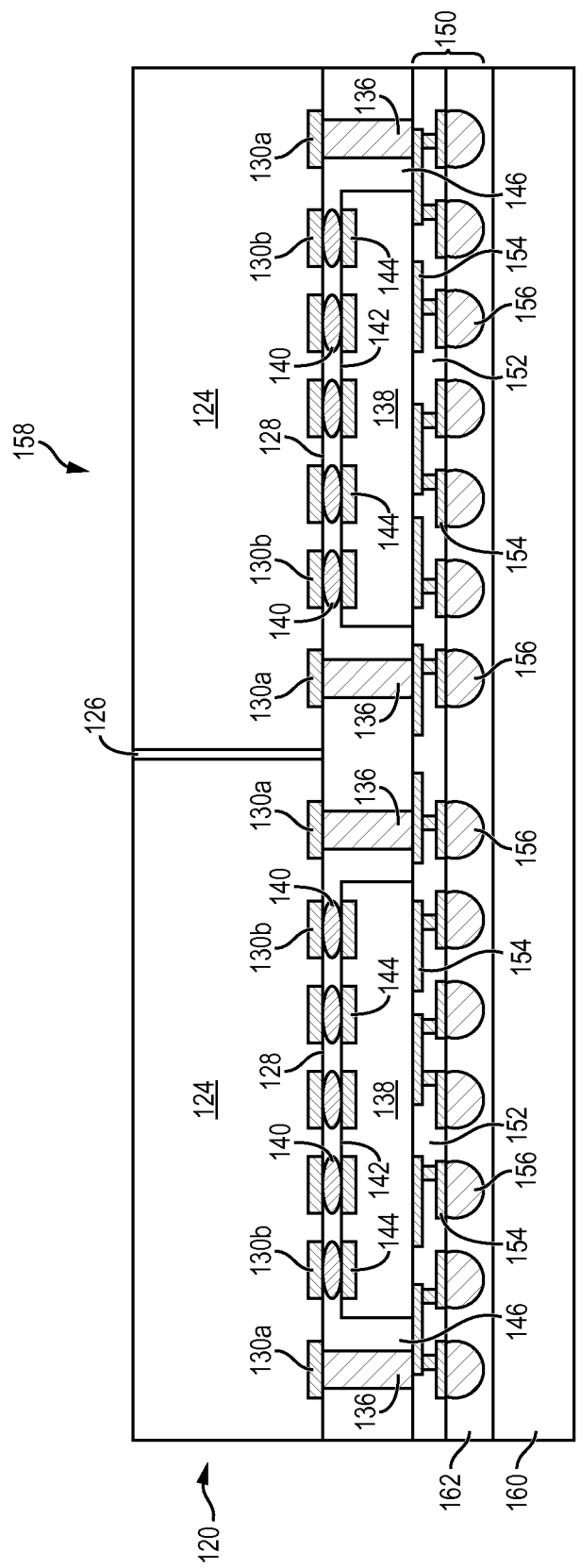
Figure 3L:
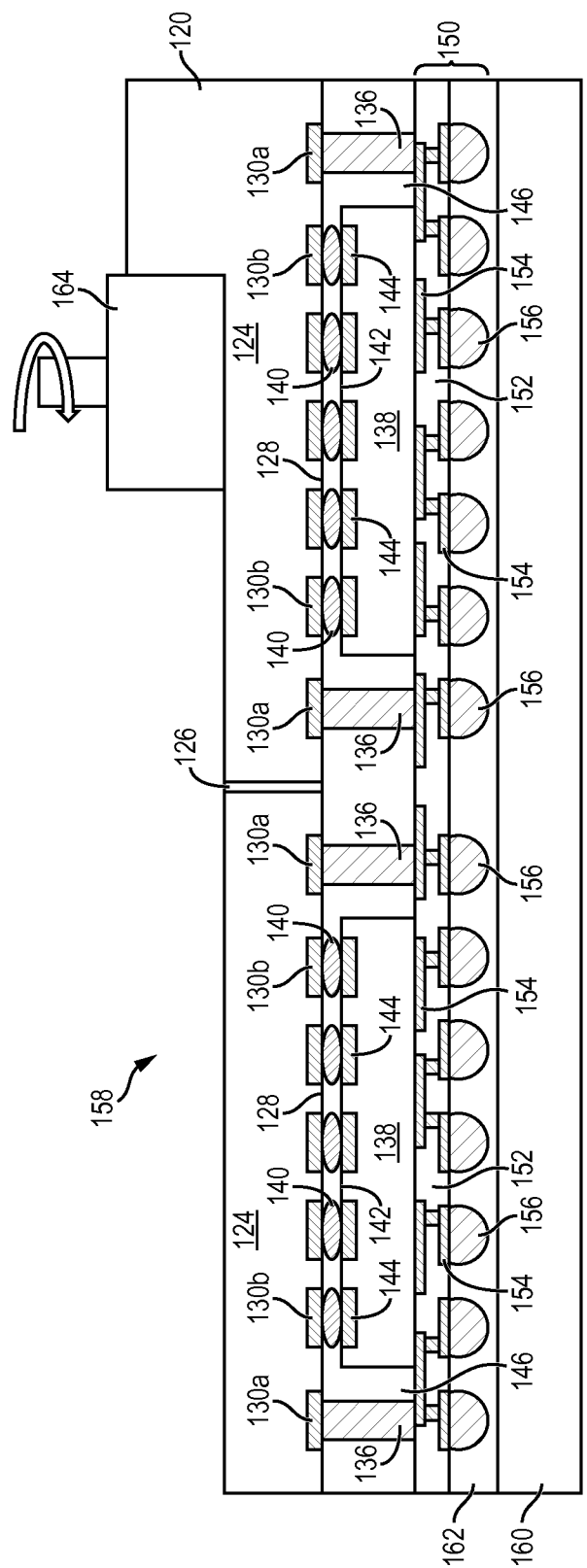
Figure 3M:
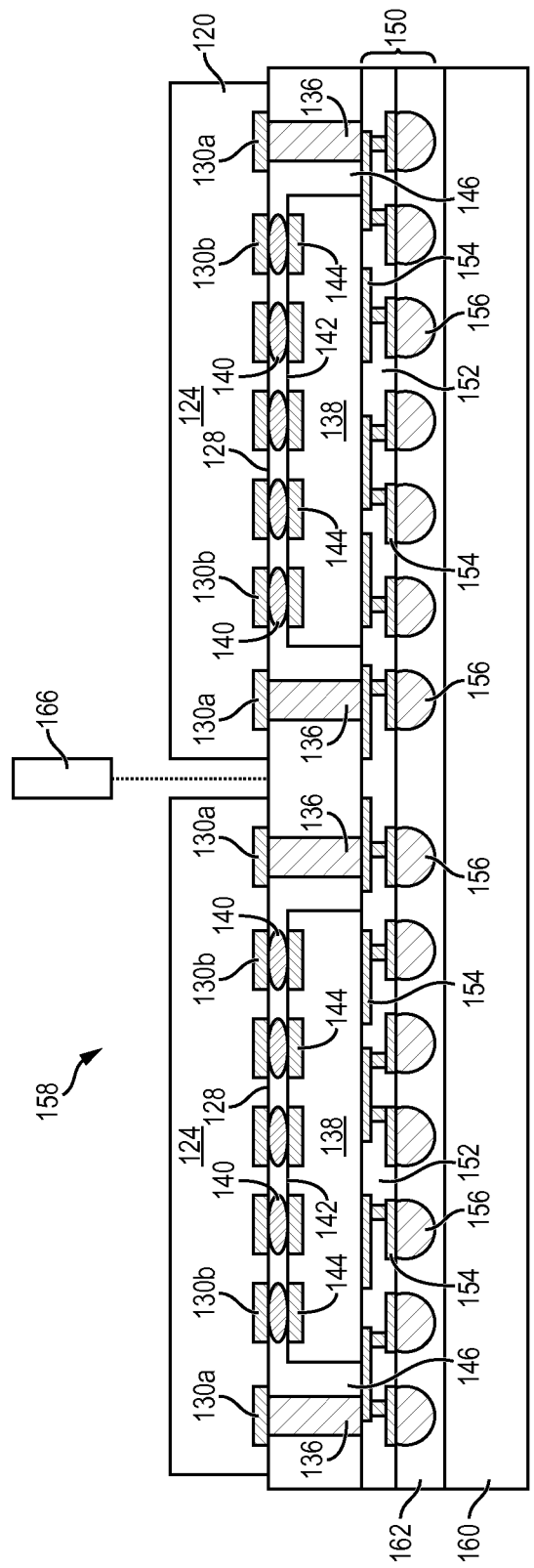
Figure 3N:
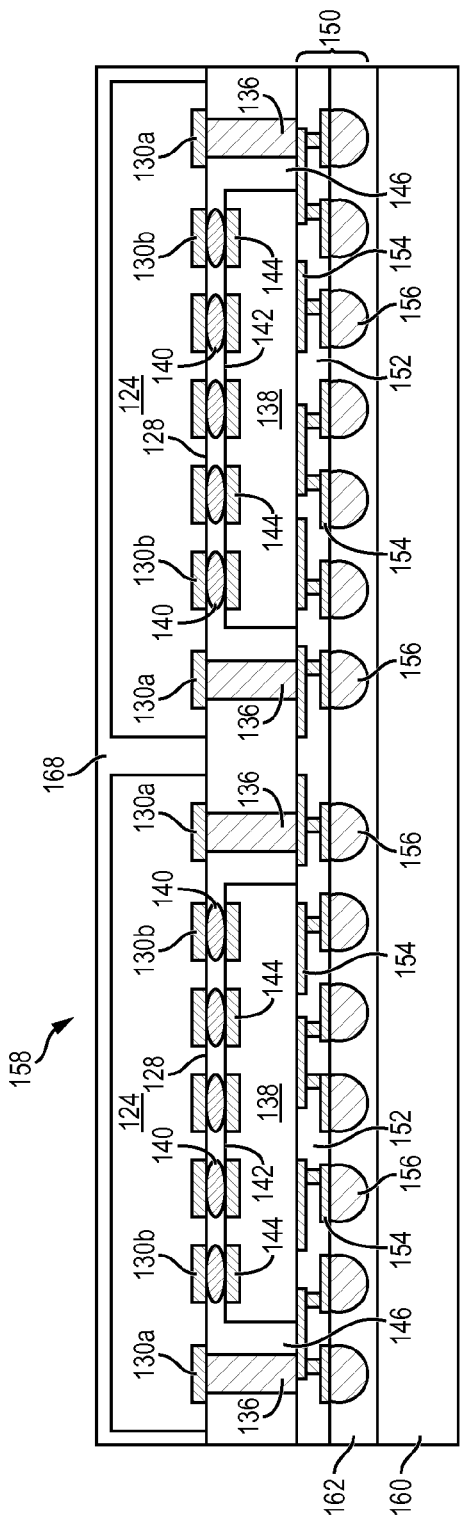
Figure 3O:
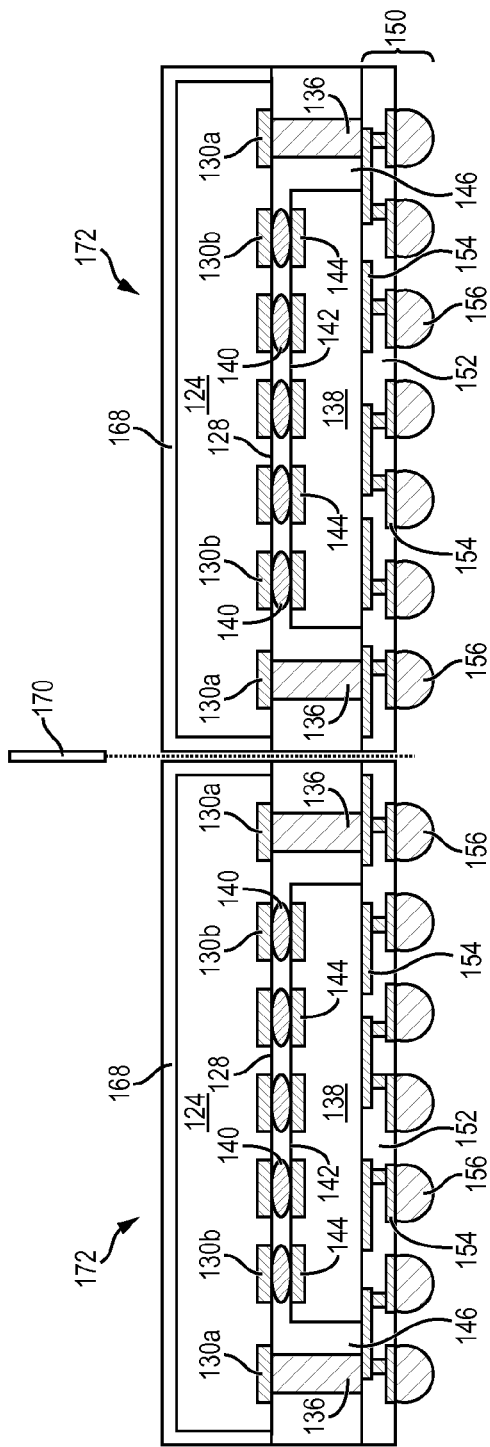

FIGS. 3a-3o illustrate, in relation to FIGS. 1 and 2a-2c, a process of forming a protective layer over exposed surfaces of a semiconductor die. FIG. 3a shows a semiconductor wafer 120 with a base substrate material, such as silicon, germanium, gallium arsenide, indium phosphide, or silicon carbide, for structural support. A plurality of semiconductor die or components 124 is formed on wafer 120 separated by saw streets 126 as described above.

FIG. 3b shows a cross-sectional view of a portion of semiconductor wafer 120. Each semiconductor die 124 includes an active surface 128 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 124 may also contain IPDs, such as inductors, capacitors, and resistors, for RF signal processing. Contact pads 130 are electrically connected to the circuits on active surface 128.

In FIG. 3c, a photoresist layer 132 is deposited over active surface 128 and contact pads 130 of semiconductor wafer 120. A portion of photoresist layer 132 over contact pads 130a is exposed and removed by an etching process. Conductive material 134 such as Cu, Al, tungsten (W), Au, or solder is formed in the removed portion of the photoresist using an electrolytic plating, electroless plating, or selective plating process.

In FIG. 3d, photoresist layer 132 is stripped away leaving conductive pillars 136 having a height ranging from 20-200 micrometers (μm). In another embodiment, stud bumps are stacked over contact pads 130a.

Semiconductor die 138 are mounted between conductive pillars 136 to contact pads 130b using bumps or microbumps 140. Semiconductor die 138 extend above conductive pillars 136. Semiconductor die 138 has an active surface 142 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 142 to implement analog circuits or digital circuits, such as DSP, ASIC, memory, or other signal processing circuit.

Semiconductor die 138 may also contain IPDS, such as inductors, capacitors, and resistors, for RF signal processing. In one embodiment, semiconductor die 138 is a flipchip type device. Bumps 140 connect to contact pads 144 which are electrically connected to the circuits on active surface 142.

In FIG. 3f, an encapsulant or molding compound 146 is deposited over semiconductor die 138 and wafer 120 using a paste printing, compressive molding, transfer molding, liquid encapsulant molding, vacuum lamination, spin coating, or other suitable applicator. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants.

In FIG. 3g, grinder 148 removes a portion of encapsulant 146 and bulk material from the backside of semiconductor die 138, opposite active surface 142, and exposes conductive pillars 136. The backside of semiconductor die 138 is coplanar with conductive pillars 136 following the grinding process in FIG. 3h.

In another embodiment, conductive pillars 136 are formed after depositing encapsulant 146 and grinding operation of FIGS. 3f-3h. Semiconductor die 138 are mounted to contact pads 130b on semiconductor wafer 120. Encapsulant 146 is deposited over semiconductor die 138 and wafer 120. A plurality of vias is formed in encapsulant 146 over contact pads 130a using laser drilling or deep reactive ion etching (DRIE). The vias are filled with Al, Cu, Sn, Ni, Au, Ag, titanium (Ti), W, poly-silicon, or other suitable electrically conductive material using electrolytic plating, electroless plating process, or other suitable metal deposition process to form conductive pillars 136.

In FIG. 3i, a build-up interconnect structure 150 is formed over conductive pillars 136, semiconductor die 138, and encapsulant 146. The build-up interconnect structure 150 includes an insulating or passivation layer 152 formed by PVD, CVD, printing, spin coating, spray coating, or thermal oxidation. The insulating layer 152 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. An electrically conductive layer 154 is formed using patterning and PVD, CVD, electrolytic plating, electroless plating process, or other suitable metal deposition process. Conductive layer 154 can be one or more layers of Al, Cu, Sn, Ni, Au, Ag, or other suitable electrically conductive material. The conductive layer 154 is electrically connected to conductive pillars 136 and operates as a redistribution layer (RDL) to extend the electrical connectivity of the conductive pillars.

An electrically conductive bump material is deposited over conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 156. In some applications, bumps 156 are reflowed a second time to improve electrical contact to conductive layer 154. The bumps can also be compression bonded to conductive layer 154. Bumps 156 represent one type of interconnect structure that can be formed over conductive layer 154. The interconnect structure can also use bond wires, conductive paste, stud bump, micro bump, or other electrical interconnect.

In FIG. 3j, a substrate or carrier 160 contains temporary or sacrificial base material such as silicon, polymer, polymer composite, metal, ceramic, glass, glass epoxy, beryllium oxide, or other suitable low-cost, rigid material for structural support. A penetrable adhesive tape 162 is applied to carrier 160. Leading with build-up interconnect structure 150, the assembly 158 described in FIGS. 3a-3i is mounted to carrier 160 such that bumps 156 penetrate adhesive tape 162, as shown in FIG. 3k.

In FIG. 3l, grinder 164 removes excess bulk material from the backside of semiconductor wafer 120, opposite active surface 128. Semiconductor wafer 120 is then singulated with saw blade or laser cutting tool 166, as shown in FIG. 3m. The cut through semiconductor wafer 120 stops at encapsulant 146 and does not extend through the encapsulant.

In FIG. 3n, a protective layer 168 is formed over and around exposed surfaces of semiconductor die 124, including the backside and sidewalls of the die exposed by cutting tool 166 down to encapsulant 146. Protective layer 168 can be an insulating layer, such as polymer, nitride, or oxide, deposited using spin coating or needle dispensing. Semiconductor die 124 and 138 are singulated with saw blade or laser cutting tool 170 into individual semiconductor devices 172, as shown in FIG. 3o. The temporary carrier 160 and tape 162 are removed by chemical etching, mechanical peel-off, CMP, mechanical grinding, thermal bake, laser scanning, or wet stripping. Protective layer 168 remains over the exposed backside and sidewalls of semiconductor die 124 after singulation and protects the die from external stress, such as dust, moisture, and mechanical force. Protective layer 168 reduces damage from external stress and increases package life.

Figure 4:
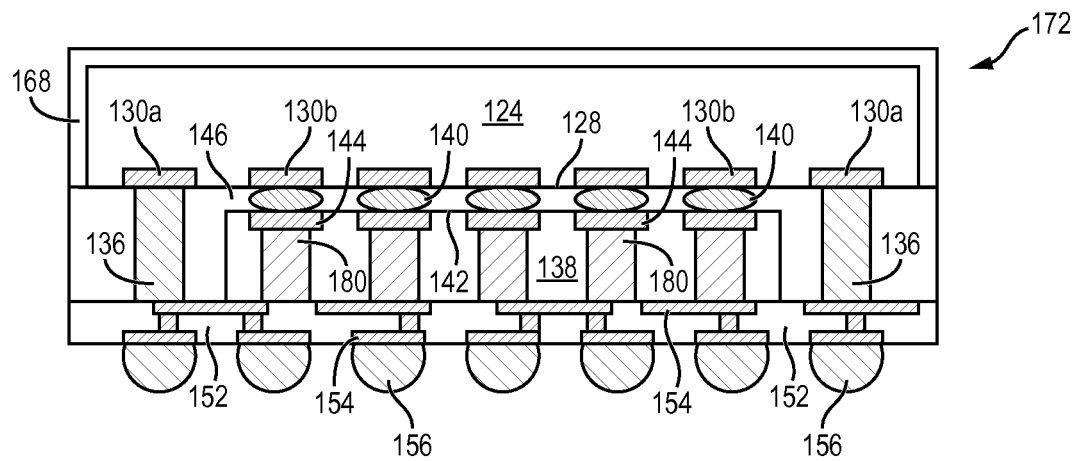
FIG. 4 illustrates conductive TSVs formed through the lower semiconductor die.

FIG. 4 shows an embodiment similar to FIG. 3o with conductive through silicon vias (TSVs) 180 formed through semiconductor die 138. A plurality of vias is formed through semiconductor die 138 using laser drilling or etching process, such as DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TSV 180 for vertical interconnectivity.

Figure 5:
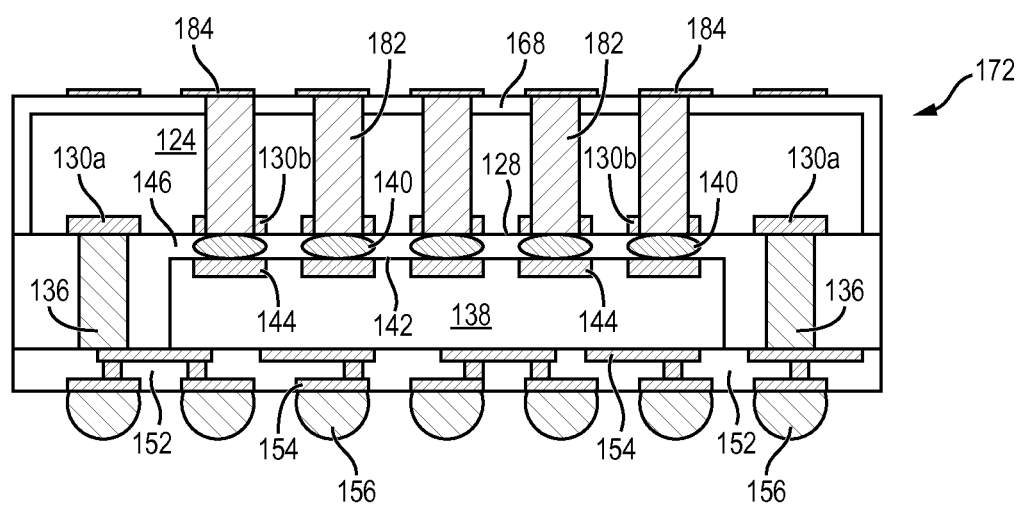
FIG. 5 illustrates conductive TSVs formed through the upper semiconductor die.

FIG. 5 shows an embodiment similar to FIG. 3o with conductive TSV 182 formed through semiconductor die 124. A plurality of vias is formed through semiconductor die 124 using laser drilling or etching process, such as DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TSV 182 for vertical interconnectivity.

An electrically conductive layer 184 is formed over protective layer 168 and conductive TSV 182 using patterning and PVD, CVD, electrolytic plating, electroless plating process, or other suitable metal deposition process. Conductive layer 184 can be one or more layers of Al, Cu, Sn, Ni, Au, Ag, or other suitable electrically conductive material. The conductive layer 184 is electrically connected to TSV 182 and operates as an RDL to extend the electrical connectivity of the TSV.

Figure 6:
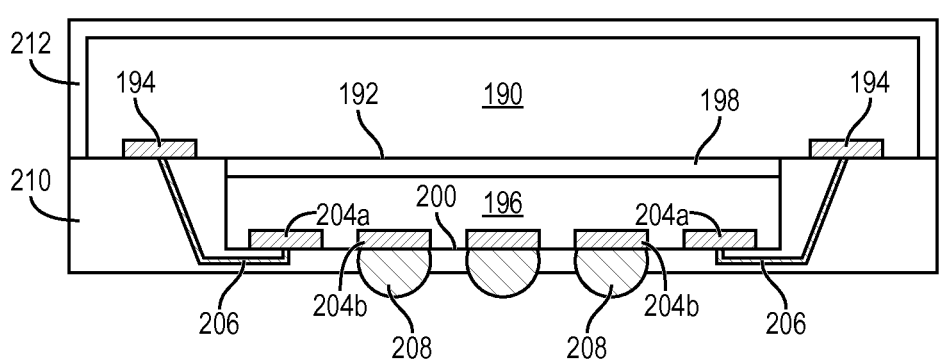
FIG. 6 illustrates the semiconductor die attached with an adhesive and interconnected by bond wires.

In FIG. 6, a plurality of semiconductor die or components 190 is formed on a semiconductor wafer, similar to FIG. 3a. Semiconductor die 190 has an active surface 192 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 192 to implement analog circuits or digital circuits, such as DSP, ASIC, memory, or other signal processing circuit. Semiconductor die 190 may also contain IPDS, such as inductors, capacitors, and resistors, for RF signal processing. Contact pads 194 are electrically connected to the circuits on active surface 192.

Semiconductor die 196 is mounted to semiconductor die 190 with die attach adhesive 198. Semiconductor die 196 has an active surface 200 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 200 to implement analog circuits or digital circuits, such as DSP, ASIC, memory, or other signal processing circuit. Semiconductor die 196 may also contain IPDS, such as inductors, capacitors, and resistors, for RF signal processing. Contact pads 204 are electrically connected to the circuits on active surface 200. Bond wires 206 are formed between contact pads 194 and 204a to interconnect the circuits on semiconductor die 190 and 196.

An electrically conductive bump material is deposited over contact pads 204b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 204b using a suitable attachment or bonding process. In one embodiment, the bump material is reflowed by heating the material above its melting point to form spherical balls or bumps 208. In some applications, bumps 208 are reflowed a second time to improve electrical connection to contact pads 204b. The bumps can also be compression bonded to contact pads 204b. Bumps 208 represent one type of interconnect structure that can be formed over contact pads 204b. The interconnect structure can also use bond wires, conductive paste, stud bump, micro bump, or other electrical interconnect.

An encapsulant or molding compound 210 is deposited over semiconductor die 190 and 196, bond wires 206, and bumps 208 using a paste printing, compressive molding, transfer molding, liquid encapsulant molding, vacuum lamination, spin coating, or other suitable applicator. Encapsulant 210 can be polymer composite material, such as epoxy resin with filler, epoxy acrylate with filler, or polymer with proper filler. Encapsulant 210 is non-conductive and environmentally protects the semiconductor device from external elements and contaminants. A portion of encapsulant 210 is removed by an etching process to partially expose bumps 208.

A protective layer 212 is formed over and around exposed surfaces of semiconductor die 190, including the backside and sidewalls of the die. Protective layer 212 can be an insulating layer, such as polymer, nitride, or oxide, deposited using spin coating or needle dispensing. Protective layer 212 remains over the exposed backside and sidewalls of semiconductor die 190 after singulation and protects the die from external stress, such as dust, moisture, and mechanical force. Protective layer 212 reduces damage from external stress and increases package life.

Figure 7:
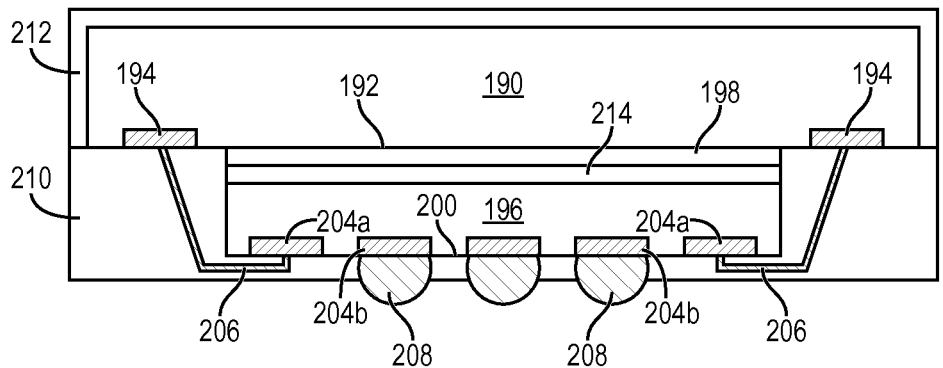
FIG. 7 illustrates a shielding layer between the semiconductor die.

FIG. 7 shows an embodiment similar to FIG. 6 with shielding layer 214 disposed between semiconductor die 190 and 196. Shielding layer 214 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 214 can also be a non-metal material such as carbon-black or aluminum flake to reduce the effects of EMI and RFI.

Figure 8:
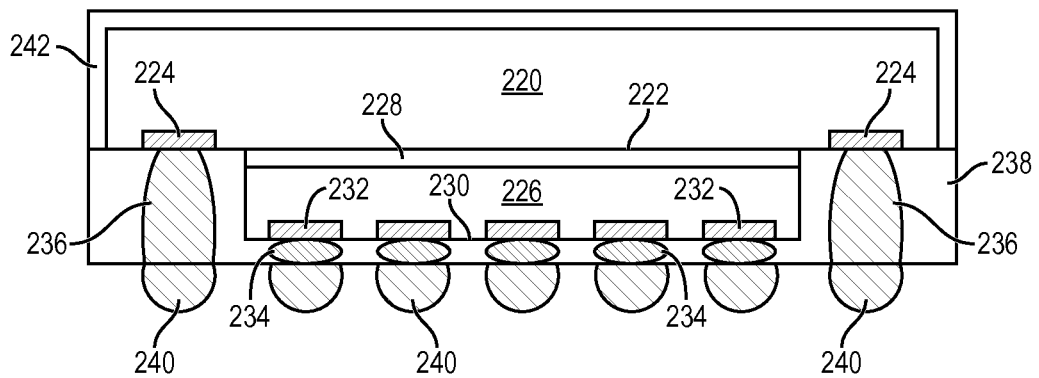
FIG. 8 illustrates an eSOP with the semiconductor die facing a common direction.

FIG. 8 shows an embedded solder on pad (eSOP) application with the semiconductor die facing a common direction. A plurality of semiconductor die or components 220 is formed on a semiconductor wafer, similar to FIG. 3a. Semiconductor die 220 has an active surface 222 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 222 to implement analog circuits or digital circuits, such as DSP, ASIC, memory, or other signal processing circuit. Semiconductor die 220 may also contain IPDS, such as inductors, capacitors, and resistors, for RF signal processing. Contact pads 224 are electrically connected to the circuits on active surface 222.

Semiconductor die 226 is mounted to semiconductor die 220 with die attach adhesive 228. A backside of semiconductor die 226 is bonded to active surface 222 of semiconductor die 220 so that both die face a common direction. Semiconductor die 226 has an active surface 230 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as DSP, ASIC, memory, or other signal processing circuit. Semiconductor die 226 may also contain IPDS, such as inductors, capacitors, and resistors, for RF signal processing. Contact pads 232 are electrically connected to the circuits on active surface 230. Bumps 234 are formed on contact pads 232.

An electrically conductive bump material is deposited over contact pads 224 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 224 using a suitable attachment or bonding process. In one embodiment, the bump material is reflowed by heating the material above its melting point to form spherical balls or bumps 236. In some applications, bumps 236 are reflowed a second time to improve electrical connection to contact pads 224. The bumps can also be compression bonded to contact pads 224. Bumps 236 represent one type of interconnect structure that can be formed over contact pads 224. The interconnect structure can also use bond wires, conductive paste, stud bump, micro bump, or other electrical interconnect.

An encapsulant or molding compound 238 is deposited over semiconductor die 220 and 226 using a paste printing, compressive molding, transfer molding, liquid encapsulant molding, vacuum lamination, spin coating, or other suitable applicator. Encapsulant 238 can be polymer composite material, such as epoxy resin with filler, epoxy acrylate with filler, or polymer with proper filler. Encapsulant 238 is non-conductive and environmentally protects the semiconductor device from external elements and contaminants. A portion of encapsulant 238 is removed by an etching process to partially expose bumps 234 and 236.

An electrically conductive bump material is deposited over bumps 234 and 236 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bumps 234 and 236 using a suitable attachment or bonding process. In one embodiment, the bump material is reflowed by heating the material above its melting point to form spherical balls or bumps 240. In some applications, bumps 240 are reflowed a second time to improve electrical contact to bumps 234 and 236. The bumps can also be compression bonded to bumps 234 and 236. Bumps 240 represent one type of interconnect structure that can be formed over bumps 234 and 236.

A protective layer 242 is formed over and around exposed surfaces of semiconductor die 220, including the backside and sidewalls of the die. Protective layer 242 can be an insulating layer, such as polymer, nitride, or oxide, deposited using spin coating or needle dispensing. Protective layer 242 remains over the exposed backside and sidewalls of semiconductor die 220 after singulation and protects the die from external stress, such as dust, moisture, and mechanical force. Protective layer 242 reduces damage from external stress and increases package life.

Figure 9:
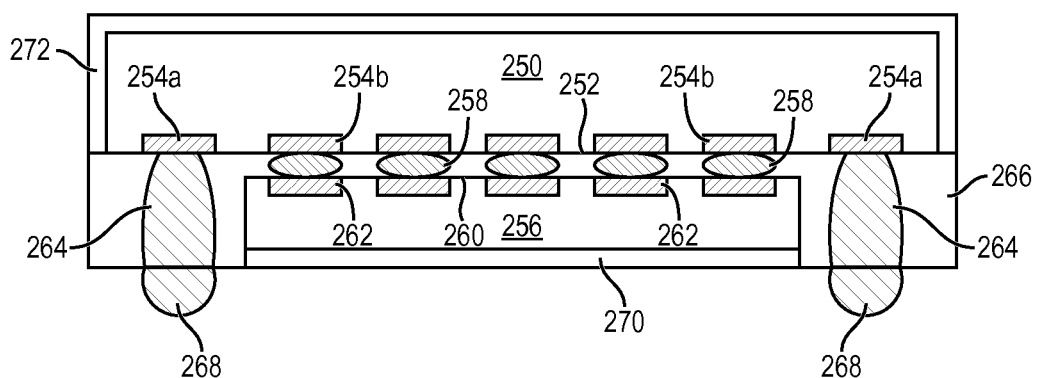
FIG. 9 illustrates an eSOP with heat sink mounted to the lower semiconductor die.

FIG. 9 shows an eSOP application with a heat sink. A plurality of semiconductor die or components 250 is formed on a semiconductor wafer, similar to FIG. 3a. Semiconductor die 250 has an active surface 252 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 252 to implement analog circuits or digital circuits, such as DSP, ASIC, memory, or other signal processing circuit. Semiconductor die 250 may also contain IPDS, such as inductors, capacitors, and resistors, for RF signal processing. Contact pads 254 are electrically connected to the circuits on active surface 252.

Semiconductor die 256 is mounted to semiconductor die 250 using bumps or microbumps 258. Semiconductor die 256 has an active surface 260 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 260 to implement analog circuits or digital circuits, such as DSP, ASIC, memory, or other signal processing circuit. Semiconductor die 256 may also contain IPDS, such as inductors, capacitors, and resistors, for RF signal processing. Contact pads 262 are electrically connected to the circuits on active surface 260. Bumps 258 are formed between contact pads 254b and contact pads 262.

An electrically conductive bump material is deposited over contact pads 254a using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 254a using a suitable attachment or bonding process. In one embodiment, the bump material is reflowed by heating the material above its melting point to form spherical balls or bumps 264. In some applications, bumps 264 are reflowed a second time to improve electrical connection to contact pads 254a. The bumps can also be compression bonded to contact pads 254a. Bumps 264 represent one type of interconnect structure that can be formed over contact pads 254a. The interconnect structure can also use bond wires, conductive paste, stud bump, micro bump, or other electrical interconnect.

An encapsulant or molding compound 266 is deposited over semiconductor die 250 and 256 and bumps 264 using a paste printing, compressive molding, transfer molding, liquid encapsulant molding, vacuum lamination, spin coating, or other suitable applicator. Encapsulant 266 can be polymer composite material, such as epoxy resin with filler, epoxy acrylate with filler, or polymer with proper filler. Encapsulant 266 is non-conductive and environmentally protects the semiconductor device from external elements and contaminants.

An electrically conductive bump material is deposited over bumps 264 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bumps 264 using a suitable attachment or bonding process. In one embodiment, the bump material is reflowed by heating the material above its melting point to form spherical balls or bumps 268. In some applications, bumps 268 are reflowed a second time to improve electrical contact to bumps 264. The bumps can also be compression bonded to bumps 264. Bumps 268 represent one type of interconnect structure that can be formed over bumps 264.

A heat sink 270 with optional thermal interface material (TIM) is mounted over a backside of semiconductor die 256, opposite active surface 260. Heat sink 270 can be Al, Cu, or another material with high thermal conductivity to provide heat dissipation for semiconductor die 256. The TIM can be aluminum oxide, zinc oxide, boron nitride, or pulverized silver. The TIM aids in the distribution and dissipation of heat generated by semiconductor die 256.

A protective layer 272 is formed over and around semiconductor die 250, including the exposed backside and sidewalls of the die. Protective layer 272 can be an insulating layer, such as polymer, nitride, or oxide, deposited using spin coating or needle dispensing. Protective layer 272 remains over the exposed backside and sidewalls of semiconductor die 250 after singulation and protects the die from external stress, such as dust, moisture, and mechanical force. Protective layer 272 reduces damage from external stress and increases package life.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a first semiconductor die;
an interconnect structure formed over the first semiconductor die;
a second semiconductor die disposed over the interconnect structure and first semiconductor die;
an encapsulant deposited over the first and second semiconductor die; and
a protective layer formed over an exposed surface of the first semiconductor die and extending to the encapsulant including a side surface of the protective layer vertically aligned with a side surface of the encapsulant.

2. The semiconductor device of claim 1, wherein the protective layer covers an exposed backside and exposed sidewalls of the first semiconductor die.

3. The semiconductor device of claim 1, further including a conductive via formed through the first semiconductor die.

4. The semiconductor device of claim 1, further including a conductive via formed through the second semiconductor die.

5. The semiconductor device of claim 1, wherein the interconnect structure includes a conductive pillar, bond wire, or bump.

6. The semiconductor device of claim 1, further including a shielding layer formed between the first and second semiconductor die.

7. The semiconductor device of claim 1, further including a heat sink formed over the second semiconductor die.

8. A semiconductor device, comprising:
   a first semiconductor die;
   a second semiconductor die disposed over the first semiconductor die;
   an encapsulant deposited over the first and second semiconductor die; and
   a protective layer formed over the first semiconductor die and extending to the encapsulant including a side surface of the protective layer vertically aligned with the encapsulant.

9. The semiconductor device of claim 8, wherein the protective layer covers an exposed backside and exposed sidewalls of the first semiconductor die.

10. The semiconductor device of claim 8, further including a conductive via formed through the second semiconductor die.

11. The semiconductor device of claim 8, further including an interconnect structure between the first semiconductor die and including a conductive pillar, bond wire, or bump.

12. The semiconductor device of claim 8, further including a shielding layer formed between the first and second semiconductor die.

13. The semiconductor device of claim 8, further including a heat sink formed over the second semiconductor die.

14. A semiconductor device, comprising:
    a first semiconductor die;
    a second semiconductor die disposed over the first semiconductor die;
    an encapsulant deposited over the second semiconductor die; and
    a protective layer formed over the encapsulant and vertically aligned with the encapsulant.

15. The semiconductor device of claim 14, wherein the protective layer covers an exposed backside and exposed sidewalls of the first semiconductor die.

16. The semiconductor device of claim 14, further including a conductive via formed through the second semiconductor die.

17. The semiconductor device of claim 14, further including an interconnect structure between the first semiconductor die and including a conductive pillar, bond wire, or bump.

18. The semiconductor device of claim 14, further including a shielding layer formed between the first and second semiconductor die.

19. The semiconductor device of claim 14, further including a heat sink formed over the second semiconductor die.

20. A semiconductor device, comprising:
    a first semiconductor die;
    an encapsulant deposited over the first semiconductor die; and
    a protective layer formed over the first semiconductor die and encapsulant and vertically aligned with the encapsulant.

21. The semiconductor device of claim 20, wherein the protective layer covers an exposed backside and exposed sidewalls of the first semiconductor die.

22. The semiconductor device of claim 20, further including a second semiconductor die disposed over the first semiconductor die.

23. The semiconductor device of claim 22, further including a conductive via formed through the second semiconductor die.

24. The semiconductor device of claim 22, further including a shielding layer formed between the first and second semiconductor die.

25. The semiconductor device of claim 22, further including a heat sink formed over the second semiconductor die.

* * * * *